United States Patent [19]
Aizawa

[11] Patent Number: 6,068,690
[45] Date of Patent: May 30, 2000

[54] PRECURSOR SOLUTION FOR FORMING THIN FILM OF FERROELECTRIC SUBSTANCE AND PRODUCTION PROCESS THEREOF

[75] Inventor: Mamoru Aizawa, Kyoto, Japan

[73] Assignee: KRI International, Inc., Osaka-Fu, Japan

[21] Appl. No.: 09/280,991

[22] Filed: Mar. 30, 1999

[30] Foreign Application Priority Data

Mar. 31, 1998 [JP] Japan .................................. 10-105484

[51] Int. Cl.$^7$ ............................ C04B 35/491; C07F 7/24; C07F 7/28; C09K 3/00
[52] U.S. Cl. ....................................... 106/287.19; 501/136
[58] Field of Search ........................ 106/287.19; 501/136

[56] References Cited

U.S. PATENT DOCUMENTS

| | | | |
|---|---|---|---|
| 4,746,366 | 5/1988 | Philipp et al. ..................... | 106/287.19 |
| 4,816,072 | 3/1989 | Harley et al. ...................... | 106/287.18 |
| 5,032,559 | 7/1991 | McSeeeny et al. ..................... | 501/137 |
| 5,656,073 | 8/1997 | Glaubitt et al. .................... | 106/287.19 |

*Primary Examiner*—David Brunsman
*Attorney, Agent, or Firm*—McDermott, Will & Emery

[57] ABSTRACT

To form a thin film of ferroelectric substance by sol-gel method, there is provided a process for obtaining a precursor solution from which a coating solution enabling to form a thin film having a film thickness enough to exhibit its property can be obtained just by one coating operation without any multi-coating. After composing a Ti alkoxide oligomer having a cyclic structure or a ladder structure by hydrolysis and poly-condensation of a Ti alkoxide and composing a Zr alkoxide oligomer by hydrolysis and poly-condensation of a Zr alkoxide, the Ti alkoxide oligomer is preliminarily hydrolyzed and reacted with the Zr alkoxide oligomer, whereby a Ti—O—Zr precursor is obtained, and a Pb(Ti—O—Zr) is obtained by reacting the Ti—O—Zr precursor with the Pb alkoxide.

6 Claims, No Drawings

PRECURSOR SOLUTION FOR FORMING THIN FILM OF FERROELECTRIC SUBSTANCE AND PRODUCTION PROCESS THEREOF

BACKGROUND OF THE INVENTION

1. Field of the Invention

The present invention relates to a precursor solution for forming a thin film of ferroelectric substance composed of a composite oxide having a perovskite structure containing a lead such as PZT(Pb(Zr, Ti)O3) or PLZT(PbO-La2O3-ZrO2-TiO2), and to a production process for producing such a precursor solution.

2. Prior Art

A thin film of perovskite group such as PZT exhibits a high permittivity or ferroelectricity and, particularly because of its superior P-E hysteresis characteristic, the thin film is used as an essential element of a FRAM which attracts an attention as a non-volatile memory of next generation. Generally, the PZT is prepared by a gaseous phase film formation process such as sputtering, CVD, or by a liquid phase film formation process such as sol-gel method. For forming a multi-component thin film such as composite perovskite, the gaseous phase film formation process has a disadvantage in the aspect of securing homogeneity. On the other hand, the sol-gel method in which start material is of liquid phase has an advantage of securing a high homogeneity in the formation of the perovskite thin film.

To exhibit a performance as a FRAM, it is necessary for any PZT thin film formed by sol-gel method to have a film thickness of about 2,500 Å. However, in any coating solution available at present, a film having a film thickness of only about 400 Å to 500 Å can be achieved by one coating operation. Therefore, in the prior art, when trying to obtain a PZT film having a film thickness of about 2,500 Å, it was necessary to carry out a multi-layer coating in which coating operation is repeated five to six times. This multi-layer coating has disadvantages of complicating the production process and giving a thermal damage to peripheral materials.

SUMMARY OF THE INVENTION

The invention was made to overcome the above-discussed disadvantages, and has an object of providing a precursor solution for forming a thin film of ferroelectric substance, from which a coating solution enabling to form a thin film having a film thickness enough to exhibit its property can be obtained just by one coating operation without any multi-coating, when a thin film of perovskite ferroelectric substance containing a lead such as PZT or PLZT is formed by sol-gel method. Another object of the invention is to provide a production process for producing such a precursor solution.

To accomplish the foregoing objects, the invention provides a precursor solution for forming a thin film of perovskite ferroelectric substance, the precursor solution being obtained from a raw material comprising a Ti alkoxide oligomer obtained by hydrolysis and polycondensation of a titanium alkoxide (Ti alkoxide), a Zr alkoxide oligomer obtained by hydrolysis and polycondensation of a zirconium alkoxide (Zr alkoxide), and a lead alkoxide (Pb alkoxide), characterized in that the Ti alkoxide oligomer has a cyclic structure or a ladder structure.

The invention provides a precursor solution, in which a part of the raw material of Pb alkoxide has a carboxylic acid residue and/or an amino alcohol residue.

The invention provides a production process for producing a precursor solution for forming a thin film of ferroelectric substance comprising the steps of composing a Ti alkoxide oligomer by hydrolysis and polycondensation of a Ti alkoxide, composing a Zr alkoxide oligomer by hydrolysis and polycondensation of a Zr alkoxide, obtaining a Ti—O—Zr precursor by preliminarily hydrolyzing the Ti alkoxide oligomer and reacting the Ti alkoxide oligomer with the Zr alkoxide oligomer, and obtaining a Pb(Ti—O—Zr) by reacting the Ti—O—Zr precursor with a Pb alkoxide, characterized in that the Ti alkoxide oligomer having a cyclic structure or a ladder structure is composed by hydrolysis and polycondensation of the Ti alkoxide.

The invention provides a production process, in which at the time of hydrolysis and polycondensation of the Ti alkoxide oligomer and/or the Zr alkoxide, molecular weight of the Ti alkoxide oligomer and/or the Zr alkoxide oligomer is adjusted by using an appropriate combination of a polar solvent and a nonpolar solvent as a reactive solvent.

The invention provides a production process, in which the hydrolysis and polycondensation of the Ti alkoxide and/or the Zr alkoxide are performed at a low temperature of not higher than −10° C. without adding any stabilizing ligand.

The invention provides a production process, in which a part of the raw material of Pb alkoxide has a carboxylic acid residue and/or an amino alcohol residue.

In the precursor solution, since the precursor solution is obtained from the raw material comprising the Ti alkoxide oligomer having a cyclic structure or a ladder structure, the precursor solution has a regular structure and, therefore, even when the precursor solution is concentrated to the extent that concentration of metal oxide is not less than 40%, any metal oxide is not deposited. Accordingly, it is possible to obtain from this precursor solution a coating solution of high concentration from which a thin film of required film thickness can be formed just by one coating operation. Further, by using cyclohexanol, etc. as a solvent, a coating solution of high viscosity of not less than 40 cps can be obtained.

In this precursor solution for forming a thin film of ferroelectric substance, when a perovskite ferroelectric thin film containing a lead such as PZT or PLZT is formed by using a sol-gel method, it is possible to prepare a coating solution from which a thin film having a film thickness enough to exhibit a property of FRAM, etc., for example, a thin film having a film thickness of about 2,500 Å, can be formed just by one coating operation without any multi-layer coating. Further, since any multi-layer coating is not required, the production process can be simplified, and there is no more disadvantage of thermal damage given to the peripheral materials.

In the precursor solution, since a part of the raw material of Pb alkoxide has a carboxylic acid residue and/or an amino alcohol residue, solubility of the precursor molecule is improved, and even when concentrated to a high concentration, occurrence of deposition can be prevented.

In this precursor solution, since the solubility of the precursor is remarkably improved, it is easy to achieve a high concentration, eventually contributing to thickening of the film.

In the production process of a precursor solution, since the Ti alkoxide oligomer having a cyclic structure or a ladder structure is composed by hydrolysis and polycondensation of the Ti alkoxide, the precursor solution obtained from the oligomer has a regular structure and, therefore, even when the precursor solution is concentrated to the extent that concentration of metal oxide is not less than 40%, any metal oxide is not deposited. Accordingly, from the precursor solution produced by this process, it is possible to obtain a coating solution of high concentration from which a thin film of required film thickness can be formed just by one coating operation. Further, by using cyclohexanol, etc. as a solvent, a coating solution of high viscosity of not less than 40 cps can be obtained.

In this production process of the precursor solution, when a thin film of perovskite ferroelectric substance containing a lead such as PZT or PLZT is formed by using a sol-gel method, a precursor solution for forming a thin film of ferroelectric substance is obtained, and it is possible to prepare from this precursor solution a coating solution from which a thin film having a film thickness enough to exhibit a property of FRAM, etc., for example, a film thickness of about 2,500 Å, can be formed just by one coating operation without any multi-layer coating.

In the production process, at the time of hydrolysis and polycondensation of the Ti alkoxide oligomer and/or the Zr alkoxide, molecular weight of the Ti alkoxide oligomer and/or the Zr alkoxide oligomer is adjusted.

In this production process, when the Ti alkoxide oligomer and/or the Zr alkoxide are hydrolyzed and polycondensed, a Ti alkoxide oligomer and/or a Zr alkoxide oligomer of appropriate molecular weight are obtained, and the mentioned advantage of the invention is exactly performed.

In the production process according to claim 5, since the hydrolysis and polycondensation of the Ti alkoxide and/or the Zr alkoxide are performed at a low temperature of not higher than –10< C., rate of reaction is restrained without adding any stabilizing ligand and, as a result, it is possible to prepare a homogeneous precursor solution enabling a homogeneous film formation.

In this production process, since a homogeneous precursor solution enabling a homogeneous film formation can be prepared without using any stabilizing ligand, thermal decomposition characteristic is corrected, and film quality is improved.

In the production process, since a part of the raw material of Pb alkoxide has a carboxylic acid residue and/or an amino alcohol residue, solubility of the precursor is improved.

In this production process, since the solubility of the precursor is improved, the process contributes to achieve a high concentration, and stability in preservation of the coating solution is improved.

DESCRIPTION OF THE PREFERRED EMBODIMENT

A preferred embodiment of the present invention is hereinafter described.

In the production process of a precursor solution for forming a thin film of ferroelectric substance according to the invention, first, using a Ti alkoxide as a start material, a solution containing a Ti alkoxide is hydrolyzed and polycondensed, whereby a Ti alkoxide oligomer having a cyclic structure or a ladder structure is composed, and using a Zr alkoxide as a start material, a solution containing a Zr alkoxide is hydrolyzed and polycondensed, whereby a Zr alkoxide oligomer is composed. Number of carbon of each alkoxyl group of the Ti alkoxide and the Zr alkoxide is not particularly defined, but usually each alkoxyl group of which number of carbon is 1 to 5 is used, and more preferably each alkoxyl group of which number of carbon is 2 to 4 is used. The solvent is not particularly limited and any single solvent or mixed solvent may be used as far as the raw material of alkoxide and the water used in the hydrolysis are respectively soluble and are not solidified at a temperature of addition of water. As the polar solvent, methanol, ethanol and propanol each being an alcohol of which number of carbon is 1 to 3 are preferably used in view of viscosity within the temperature range of adding water and easiness in removal. It is also preferable to combine a polar solvent and a nonpolar solvent. For example, by hydrolyzing the Ti alkoxide in the polar solvent such as alcohol without any stabilizing ligant, a trimer of cyclic structure or an oligomer of ladder structure is composed. Then, by hydrolyzing the Zr alkoxide using a reactive solvent composed by mixing a nonpolar solvent such as toluene with a polar solvent such as alcohol, the polymerization degree of oligomer is controlled. It is also preferable that the reaction of hydrolysis and polycondensation of the Ti alkoxide and/or the Zr alkoxide is performed at a low temperature not higher than –10° C., for example, at –60° C. BY performing the hydrolysis and polycondensation at a low temperature, reaction rate is controlled, and a homogeneous precursor solution is prepared without stabilizing the alkoxide by adding any stabilizing ligand.

Then, the Ti alkoxide oligomer is preliminarily hydrolyzed, and reacted with the Zr alkoxide oligomer, thereby a Ti—O—Zr precursor being prepared. By reacting this Ti—O—Zr precursor with a Pb alkoxide, a Pb (Ti—O—Zr) precursor solution is obtained. It is preferable that a part of the raw material of Pb alkoxide is a Pb alkoxide compound containing a carboxylic acid residue and/or at least one amino alcohol residue.

The precursor solution thus obtained is then concentrated to an appropriate concentration, and used as a coating solution for forming a thin film of ferroelectric substance. In this respect, note that the precursor solution prepared according to the known art is inferior in solubility of metal oxide. Therefore, when such a known precursor solution is concentrated to have a metal oxide concentration of about 10%, deposition of precipitate begins to take place, which means that the coating solution prepared is considerably inferior in coating performance. On the contrary, in the precursor solution prepared by the above-described process according to the invention, even when concentrated to have a metal oxide concentration of about 20 to 40%, any deposition of precipitate does not take place. Accordingly, from this precursor solution, it is possible to obtain a coating solution of high metal oxide concentration enabling to form a thin film of about 2,500 Å in film thickness. Further, by using cyclohexanol or the like as a solvent, a coating solution of a high viscosity of not lower than 40 cps can be obtained.

Several examples to which the invention is specifically applied are hereinafter described.

EXAMPLE 1

[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated isopropyl alcohol. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.

[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated isopropyl alcohol. 0.2 mol (20.02 g) of acetylacetone is dissolved in 100 ml of isopropyl alcohol, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.

[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.

[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.

[Addition of Raw Material of Pb Alkoxide]

0.2 mol (65.26 g) of Pb2-aminoethoxy-acetate [Pb(NH$_2$CH$_2$CH$_2$O)(CH$_3$COO)] is dissolved in 200 ml of dehydrated isopropyl alcohol, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

EXAMPLE 2

[Hydrolysis and Polycondensation of Ti Alkoxide]

A stirrer for magnetic stirring is put in a two-liter round bottom flask with four mouths on which a dry pipe, a Dimroth condenser, a thermometer land a septum of silicon rubber are mounted. 0.1 mol (28.42 g) of tetraisopropoxytitanium is sampled into the flask, and dissolved in 100 ml of dehydrated isopropyl alcohol. A solution thus obtained is cooled to −60° C. using a dry ice/methanol cold bath. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.

[Hydrolysis and Polycondensation of Zr alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated isopropyl alcohol. 0.2 mol (20.02 g) of acetylacetone is dissolved in 100 ml of isopropyl alcohol, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.

[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.

[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.

[Addition of Raw Material of Pb Alkoxide]

0.2 mol (65.26 g) of Pb2-aminoethoxy-acetate [Pb(NH$_2$CH$_2$CH$_2$O)(CH$_3$COO)] is dissolved in 200 ml of dehydrated isopropyl alcohol, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

EXAMPLE 3

[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated toluene. 0.1 mol (1.80 g) of hydrochloric acid water of 0.001N is sampled into another vessel, and diluted in 500 ml of dehydrated toluene. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.

[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated toluene. 0.2 mol (20.02 g) of acetylacetone is dissolved in 100 ml of dehydrated toluene, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated toluene. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B. ps [Partial Hydrolysis of Ti Alkoxide Oligomer (Solution A)]

0.033 mol (0.60 g) of hydrochloric acid water of 0.001N is diluted in 150 ml of dehydrated toluene, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.

[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.

[Addition of Raw Material of Pb Alkoxide]

0.2 mol (65.26 g) of Pb2-aminoethoxy-acetate [Pb(NH$_2$CH$_2$CH$_2$O)(CH$_3$COO)] is dissolved in 200 ml of dehydrated toluene, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

Comparative Example 1

[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated isopropyl alcohol. 0.2 mol (20.02 g) of acetylacetone is dissolved in 100 ml of isopropyl alcohol, and a solution thus obtained is added to the tetraisopropoxytitanium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.

[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated isopropyl alcohol. 0.2 mol (20.02 g) of acetylacetone is dissolved in 100 ml of isopropyl alcohol, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.

[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.

[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.

[Addition of Raw Material of Pb Alkoxide]

0.2 mol (65.26 g) of Pb2-aminoethoxy-acetate [Pb(NH$_2$CH$_2$CH$_2$O)(CH$_3$COO)] is dissolved in 200 ml of dehydrated isopropyl alcohol, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

Comparative Example 2

[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated isopropyl alcohol. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.

[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 500 ml of dehydrated isopropyl alcohol. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.

[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.
[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.
[Addition of Raw Material of Pb Alkoxide]

0.2 mol (65.26 g) of Pb2-aminoethoxy-acetate [Pb(NH$_2$CH$_2$CH$_2$O)(CH$_3$COO)] is dissolved in 200 ml of dehydrated isopropyl alcohol, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

Comparative Example 3
[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated isopropyl alcohol. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.
[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated isopropyl alcohol. 0.2 mol (20.02 g) of acetylacetone is dissolved in 100 ml of isopropyl alcohol, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.
[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.
[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.
[Addition of Raw Material of Pb]

0.2 mol (75.86 g) of lead (II) acetate tri-hydrate is dissolved in 200 ml of dehydrated isopropyl alcohol, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

Comparative Example 4
[Hydrolysis and Polycondensation of Ti Alkoxide]

A stirrer for magnetic stirring is put in a two-liter round bottom flask with four mouths on which a dry pipe, a Dimroth condenser, a thermometer and a septum of silicon rubber are mounted. 0.1 mol (28.42 g) of tetraisopropoxytitanium is sampled into the flask, and dissolved in 500 ml of dehydrated isopropyl alcohol. 0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution A.
[Hydrolysis and Polycondensation of Zr Alkoxide]

A stirrer for magnetic stirring is put in a two-liter round bottom flask with four mouths on which a dry pipe, a Dimroth condenser, a thermometer and a septum of silicon rubber are mounted. 0.1 mol (38.37 g) of tetranormalbutoxyzirconium is sampled into the flask, and dissolved in 400 ml of dehydrated isopropyl alcohol. 0.2 mol (20.02 g) of acetylacetone is dissolved in 100 ml of isopropyl alcohol, and a solution thus obtained is added to the tetranormalbutoxyzirconium solution. A mixed solution thus obtained is then stirred. The mixed solution is refluxed for 1 hour, and naturally cooled after the reflux.

0.1 mol (1.80 g) of hydrochloric acid water of 0.001N is sampled into another vessel, and diluted in 500 ml of dehydrated isopropyl alcohol. A solution thus obtained is then dropped into the flask using a micro-tube pump. The drop speed at this time is about 4 ml/min. After mixing the solution in the flask, by heating with an oil bath, the mixed solution is refluxed for 8 hours, and naturally cooled after the reflux. A solution obtained in this manner is hereinafter referred to as solution B.
[Partial Hydrolysis of Ti Alkoxide Oligomer (Solution A)]

0.033 mol (0.60 g) of hydrochloric acid water of 0.001N is diluted in 150 ml of dehydrated isopropyl alcohol, and the solution thus obtained is dropped into the solution A using a micro-tube pump. The drop speed at this time is about 4 ml/min. The mixed solution is stirred for 30 minutes at a room temperature. A solution obtained in this manner is hereinafter referred to as solution C.
[Preparation of Ti—O—Zr Precursor]

The solution B is added to the solution C, and by heating with an oil bath, the mixed solution is refluxed for 2 hours, and naturally cooled after the reflux. A solution obtained in this manner is hereinafter referred to as solution D.
[Addition of Raw Material of Pb Alkoxide]

0.2 mol (59.46 g) of Pb (II) ethoxide is dissolved in 200 ml of dehydrated isopropyl alcohol, and 0.4 mol of acethyl acetone is added to a solution thus obtained. Thereafter, by heating with an oil bath, the mixed solution is refluxed for 1 hour, and naturally cooled after the reflux, and a solution thus obtained is added to the solution D. By heating with an oil bath, the mixed solution is refluxed for 2 hours, and naturally cooled after the reflux.

Then, the obtained solution is concentrated up to a predetermined concentration at a temperature not higher than 70° C. using a rotary evaporator.

[Concentration Test of Solution]

The solutions obtained respectively in Examples 1 to 3 and in Comparative Examples 1 to 4 were concentrated, and concentrations of metal oxide in which insoluble component was deposited were respectively acknowledged. With regard to the precursor solutions obtained respectively in Examples 1 to 3, polymerization degree of Ti alkoxide oligomer was measured by cryoscopic method. Table 1 shows the results.

TABLE 1

|  | Concentration | Polymerization Degree |
| --- | --- | --- |
| Example 1 | 42.5% | 3 |
| Example 2 | 41.8% | 3 |
| Example 3 | 43.2% | 50 |
| Comparative Example 1 | 8.7% | — |
| Comparative Example 2 | Precipitate deposited | — |
| Comparative Example 3 | 10.2% | — |
| Comparative Example 4 | Precipitate deposited | — |

It is understood from Table 1 that in the precursor solutions according to the invention, any deposition of precipitate does not take place even when concentrated to a concentration not lower than 40%, and it is possible to prepare a coating solution of high concentration from these precursor solutions.

[Film Formation Test]

The solutions obtained respectively in Examples 1 to 3 and in Comparative Examples 1 to 4 were concentrated to the extent that concentration of metal oxide is 15% otherwise concentrated to a concentration as high as possible, whereby coating solutions were respectively prepared. Films were formed by applying each coating solution to a surface of a silicon substrate with by spin coating. Revolution of spin at this time was 2,000 rpm, and the substrate was kept rotated for 30 sec at the revolution. Thereafter, the films formed by coating were dried under the atmosphere of laboratory, then heated to a temperature of 700° C. at a temperature rise rate of 10° C./min, and after being kept for 30 min at this temperature, the coating films were naturally cooled. Table 2 shows condition of film, film thickness, and condition of crystallization of the thin films obtained respectively.

TABLE 2

|  | Condition of Film | Film Thickness | Crystal |
| --- | --- | --- | --- |
| Example 1 | Good | 4,700 | Perovskite |
| Example 2 | Good | 4,500 | Perovskite |
| Example 3 | Good | 5,100 | Perovskite |
| Comparative Example 1 | Cracked | 900 | Perovskite |
| Comparative Example 2 | Not suitable for film formation |  | Perovskite |
| Comparative Example 3 | Cracked | 1,000 | Perovskite |
| Comparative Example 4 | Not suitable for film formation |  | Perovskite |

It is understood from Table 2 that the thin films formed by using the coating solutions prepared from the precursor solutions according to the invention are preferable in the condition of film, and have a sufficient thickness by just one coating operation.

What is claimed is:

1. A precursor solution for forming a thin film of perovskite ferroelectric substance, said precursor solution being obtained from a raw material comprising a titanium alkoxide oligomer obtained by hydrolysis and polycondensation of a titanium alkoxide, a zirconium alkoxide oligomer obtained by hydrolysis and polycondensation of a zirconium alkoxide, and a lead alkoxide, wherein said titanium alkoxide oligomer has a cyclic structure or a ladder structure.

2. The precursor solution according to claim 1, wherein a part of said raw material comprising said lead alkoxide has a carboxylic acid residue and/or an amino alcohol residue.

3. A production process for producing a precursor solution for forming a thin film of ferroelectric substance comprising the steps of:

composing a titanium alkoxide oligomer by hydrolysis and polycondensation of a titanium alkoxide;

composing a zirconium alkoxide oligomer by hydrolysis and polycondensation of a Zr alkoxide;

obtaining a Ti—O—Zr precursor by preliminarily hydrolyzing said titanium alkoxide oligomer and reacting said titanium alkoxide oligomer with said zirconium alkoxide oligomer; and obtaining a Pb(Ti—O—Zr) precursor by reacting said Ti—O—Zr precursor with said lead alkoxide;

wherein said titanium alkoxide oligomer having a cyclic structure or a ladder structure is composed by hydrolysis and polycondensation of said titanium alkoxide.

4. The production process according to claim 3, wherein at the time of hydrolysis and polycondensation of said titanium alkoxide oligomer and/or said zirconium alkoxide, molecular weight of the titanium alkoxide oligomer and/or the zirconium alkoxide oligomer is adjusted by using an appropriate combination of a polar solvent and a nonpolar solvent as a reactive solvent.

5. The production process according to claim 3, wherein said hydrolysis and polycondensation of the titanium alkoxide and/or the zirconium alkoxide are performed at a low temperature of not higher than −10° C. without adding any stabilizing ligand.

6. The production process according to claim 3, wherein a part of said raw material comprising the lead alkoxide has a carboxylic acid residue and/or an amino alcohol residue.

* * * * *